(12) United States Patent
Hosono et al.

(10) Patent No.: US 6,859,401 B2
(45) Date of Patent: Feb. 22, 2005

(54) FAIL NUMBER DETECTING CIRCUIT OF FLASH MEMORY

(75) Inventors: Koji Hosono, Yokohama (JP); Tamio Ikehashi, Yokohama (JP); Tomoharu Tanaka, Yokohama (JP); Kenichi Imamiya, Tokyo (JP); Hiroshi Nakamura, Fujisawa (JP); Ken Takeuchi, Tokyo (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 10/674,404

(22) Filed: Oct. 1, 2003

(65) Prior Publication Data

US 2004/0062099 A1 Apr. 1, 2004

Related U.S. Application Data

(63) Continuation of application No. 10/315,050, filed on Dec. 10, 2002, now Pat. No. 6,657,896, which is a continuation of application No. 09/985,017, filed on Nov. 1, 2001, now Pat. No. 6,507,518.

(30) Foreign Application Priority Data

Nov. 1, 2000 (JP) ........................................ 2000-335180

(51) Int. Cl.[7] .............................................. G11C 16/04
(52) U.S. Cl. ........................... 365/189.05; 365/185.17; 365/189.07
(58) Field of Search ...................... 365/189.05, 185.17, 365/189.07

(56) References Cited

U.S. PATENT DOCUMENTS

| | | | |
|---|---|---|---|
| 5,258,958 A | 11/1993 | Iwahashi et al. | |
| 5,467,315 A | * 11/1995 | Kajimoto et al. | ........... 365/222 |
| 5,610,859 A | 3/1997 | Nakamura et al. | |
| 5,761,122 A | 6/1998 | Nakamura et al. | |
| 5,909,399 A | 6/1999 | Tanaka et al. | |
| 5,963,462 A | 10/1999 | Engh et al. | |
| 6,064,603 A | 5/2000 | Naganawa | |
| 6,134,140 A | 10/2000 | Tanaka et al. | |
| 6,208,560 B1 | 3/2001 | Tanaka et al. | |
| 6,275,417 B1 | 8/2001 | Lee et al. | |
| 6,314,044 B1 | * 11/2001 | Sasaki et al. | .......... 365/230.03 |
| 6,373,748 B2 | 4/2002 | Ikehashi et al. | |
| 6,430,090 B1 | 8/2002 | Homma | |
| 6,507,518 B2 | * 1/2003 | Hosono et al. | ........ 365/185.22 |
| 6,657,896 B2 | * 12/2003 | Hosono et al. | ........ 365/185.22 |

FOREIGN PATENT DOCUMENTS

| | | |
|---|---|---|
| JP | 7-57482 | 3/1995 |
| JP | 7-307098 | 11/1995 |
| JP | 11-176175 | 7/1999 |
| KR | 2000-0043033 A | 7/2000 |
| KR | 2000-0046809 A | 7/2000 |

* cited by examiner

Primary Examiner—Richard Elms
Assistant Examiner—Tuan Nguyen
(74) Attorney, Agent, or Firm—Banner & Witcoff, Ltd.

(57) ABSTRACT

A semiconductor device includes a memory cell array, latch circuits, first to third circuits and a current control circuit. The memory cell array includes NAND cells arranged therein. The latch circuits temporarily hold data read out from the memory cell array. The first circuit generates a first current varying in proportion to "1" or "0" of binary logic data of one end of the plurality of latch circuits. The second circuit generates a second current which is preset. The third circuit compares the first current with the second current. The value of "1" or "0" of binary logic data of the one end of the plurality of latch circuits is detected based on a result of the comparison between the first current and the second current.

45 Claims, 10 Drawing Sheets

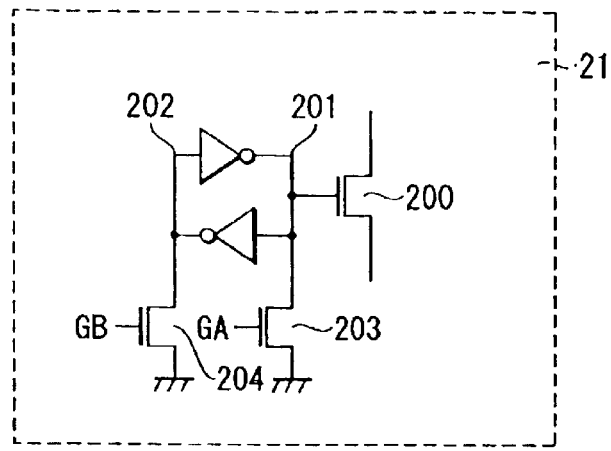
FIG. 5
| (B2, B1, B0) | Ipass | Detection Number of Fails |
|---|---|---|
| (0, 0, 0) | 0.5I | $\geq 1$ |
| (0, 0, 1) | 1.5I | $\geq 2$ |
| (0, 1, 0) | 2.5I | $\geq 3$ |
| (0, 1, 1) | 3.5I | $\geq 4$ |
| (1, 0, 0) | 4.5I | $\geq 5$ |
| (1, 0, 1) | 5.5I | $\geq 6$ |
| (1, 1, 0) | 6.5I | $\geq 7$ |
| (1, 1, 1) | 7.5I | $\geq 8$ |
FIG. 6
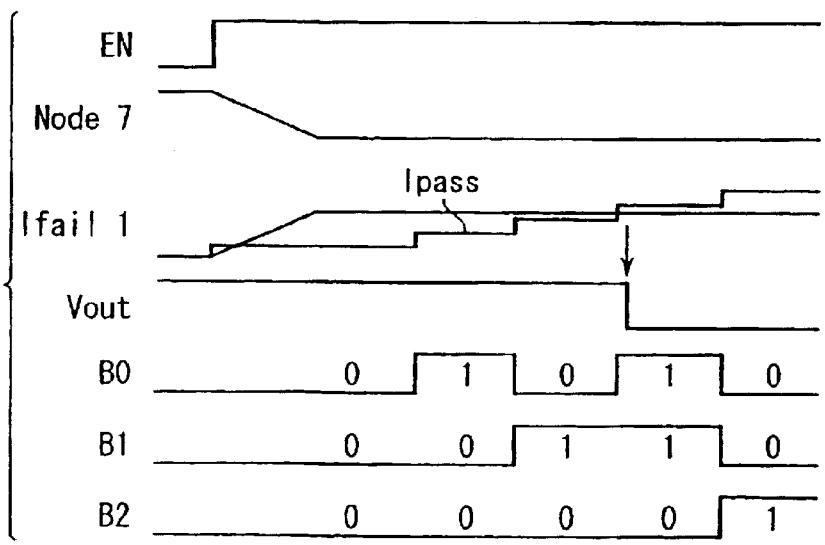
FIG. 7

| | |
|---|---|
| I/00 | 1 |
| I/01 | 2 |
| I/02 | 0 |
| I/03 | 0 |
| I/04 | 0 |
| I/05 | 0 |
| I/06 | 0 |
| I/07 | 3 |

Total Fail Bits: 6

FIG. 11

FAIL NUMBER DETECTING CIRCUIT OF FLASH MEMORY

CROSS-REFERENCE TO RELATED APPLICATIONS

This application is a continuation of prior U.S. application Ser. No. 10/315,050, filed Dec. 10, 2002, now U.S. Pat. No. 6,657,896 which is a continuation of Ser. No. 09/985,017, filed Nov. 1, 2001, now U.S. Pat. No. 6,507,518 which is based upon and claims the benefit of priority from the prior Japanese Patent Application No. 2000-335180, filed Nov. 1, 2000, the entire contents of which are incorporated herein by reference.

BACKGROUND OF THE INVENTION

1. Field of the Invention

This invention relates to a semiconductor memory device such as a flash memory and more particularly to a method which is used for detecting the result of verify readout in the programming operation and erase operation and is adequately applied to a flash memory having a large batch processing unit.

2. Description of the Related Art

In a flash memory, the effective programming speed and erase speed are enhanced by programming data in the unit of page and performing the erase operation in the unit of page or in the unit of plural pages. In the programming operation in the page unit, a program pulse applying operation and verify readout operation are performed after program data is serially input and data is input to registers of one page, and then the program pulse applying operation and verify readout operation are repeatedly performed until whole data of the page is programmed. At this time, two methods are conventionally used to determine whether whole data in the page has been programmed or not.

The first method is to detect data of the verify readout result from the all of the registers of the page since the verify readout result is latched in the registers in one page after the verify readout operation was effected after the program pulse applying operation. The first method is schematically explained with reference to FIG. 1.

FIG. 1 is a block diagram showing a core section of a NAND flash memory. In the core section, a memory cell array 100, input/output buffer 110, row decoder 120 and the like are provided. The memory cell array 100 uses different I/O at the time of data input/output and is divided into a plurality of memory cell regions 100-0, 100-1, . . . , 100-i (well regions are not divided). For example, the memory cell array is divided into regions 100-0 to 100-511 when one page is constructed by 512 columns. In FIG. 1, for example, the memory cell 100 which is constructed by eight I/Os is shown and data of one page is supplied via column selection gates controlled by column selection signals CSL0, CSL1, . . . , CSLi and input/output via the input/output buffer 110 (I/O0 to I/O7) for each byte (for each register group 10a of one byte).

Each NAND memory cell 130 is configured by two selection transistors S1, S2 whose gates are respectively connected to selection gate lines SGS, SGD and memory cells MC0, MC1, . . . , MC15 whose current paths are serially connected between the selection transistors S1 and S2 and whose gates are respectively connected to word lines WL0, WL1, . . . , WL15. One end of the current path of the selection transistor S1 is connected to a source line CELSRC and one end of the current path of the selection transistor S2 is connected to a corresponding one of bit lines BL0_0 to BL0_7. The selection gate lines SGS, SGD and word lines WL0, WL1, . . . , WL15 are supplied with predetermined voltage from the row decoder 120.

The bit lines BL0_0 to BL0_7 are respectively connected to registers (page buffers) P/B_0 to P/B_7 which temporarily hold program data. The registers P/B_0 to P/B_7 respectively correspond to the data input/output buffers I/O0 to I/O7 and correspond to the same address in the register group 10a of one byte. Since registers P/B which are connected to other bit lines BLi_0 to BLi_7 in the same manner as described above are provided, registers of the same number are connected for memory cells of one page which are dealt with as a programming unit (i.e. 512 Byte).

Each of the registers P/B_0 to P/B_7 is used for performing both of the operations for holding program data and holding readout data and the verify readout result is held in each of the registers P/B_0 to P/B_7. Therefore, information on whether whole data in one page could be programmed or not can be acquired by reading out and supplying data of the registers P/B_0 to P/B_7 to signal lines DIO0 to DIO7 and directly counting a data number (which is hereinafter simply referred to as a fail number) corresponding to the number of programming fails. In the first method, time for reading out whole data of the registers in one page is required, but it is possible to specifically acquire information on the fail number by use of a counter circuit (not shown) or the like.

On the other hand, the second method is to detect output nodes of registers in one page based on the OR logic. This example is explained with reference to FIG. 2. In the example of FIG. 2, signal lines (nodes) COM0, COM1, . . . , COMi used for outputting data after the verify readout operation are led out from the register group 10a of one byte and respectively connected to the gates of PMOS (P-channel MOS) transistors 22-0 to 22-i and the PMOS transistors 22-0 to 22-i are connected together via fuse elements (Fuse) 21-0 to 21-i in a wired OR configuration. The current path of an NMOS (N-channel MOS) transistor 300 is connected between a common node LSEN of the fuse elements 21-0 to 21-i and the ground node and the gate thereof is controlled by a detection signal VERIFY. Before the detection operation, the signal VERIFY is controlled and set at the "H" level and the common node LSEN is set at an "L" level.

The fuse elements 21-0 to 21-i are provided to separate a defective column which cannot be used for correctly programming data from the detection operation. In a case where the signal VERIFY is set to the "L" level, the register group 10a of each column is connected to the signal lines COM0 to COMi of each column at preset timing and an "L" level is output to a signal line COMj ($0 \leq j \leq i$) of a certain column, then the common node LSEN is charged from the "L" level set in the initial state to the "H" level via the PMOS transistor 22-j and fuse element 21-j. Since current passage circuits respectively formed by serially connecting the PMOS transistors 22-0 to 22-i and the fuse elements 21-0 to 21-i are connected in parallel, the common node LSEN cannot be maintained at the "L" level if the signal lines COM0 to COMi of all of the columns do not output the "H" level. Therefore, whether or not pass results of verify readout are held in all of the registers can be detected by making such a construction that data of the register 10b which holds the fail result is output to the signal line COMj as the "L" level. With the above method, a period required for outputting data from the register group 10a to the signal lines COM0 to COMi and a period required for determining the potential of the common node LSEN can be made short and the presence or absence of the program fail state can be detected by the batch processing operation.

However, in the case of the first method, it takes a long time to acquire the result, and in the case of the second method, only information that all of the columns in the page have passed can be acquired.

When the fail number detecting operation is performed in the erase operation or during the normal program operation, the operation speed of the second method is high and it is functionally sufficient. However, when a defective column is contained, the second method can be functionally used only after cutting off a fuse element among the fuse elements 21-0 to 21-i which corresponds to the defective column. This is because a defective column section continuously holds fail data in some cases. Therefore, a test process which can be performed only after cutting off the fuse element is provided, the efficiency is lowered.

Further, the state may be permitted as the pass state in some cases if an error correction function is provided inside or outside the semiconductor memory device and the number of fails occurring in the program operation or erase operation is smaller than a preset number within a range of the error correction processing ability. In this case, it is possible to detect a preset number of fails by use of the first method, but it is required to serially read out data after the verify readout operation from all of the registers in the page and there occurs a problem that it takes a long time.

Therefore, it is desired to determine whether the verify readout results are all passed or not and develop a method for detecting the fail number at high speed.

BRIEF SUMMARY OF THE INVENTION

According to an aspect of the present invention, there is provided a semiconductor device comprising a memory cell array having NAND cells arranged therein, a plurality of latch circuits which temporarily hold data read out from the memory cell array, a first circuit configured to generate a first current varying in proportion to "1" or "0" of binary logic data of one end of the plurality of latch circuits, a second circuit configured to generate a second current which is preset, and a third circuit configured to compare the first current with the second current wherein the value of "1" or "0" of binary logic data of the one end of the plurality of latch circuits is detected based on a result of the comparison between the first current and the second current.

According to still another aspect of the present invention, there is provided a semiconductor memory device comprising a memory cell array having electrically rewritable nonvolatile memory cells arranged therein; a plurality of latch circuit groups each including a preset number of latch circuits which temporarily hold data read out from the memory cell array; a first circuit which is configured to generate a first current varying in proportion to "1" or "0" of binary logical data of one end of the plurality of latch circuit groups; a second circuit which is configured to generate a second preset current; and a third circuit which is configured to compare the first current with the second current; wherein the number of "1" or "0" of binary logical data of one end of the plurality of latch circuit groups is detected based on the result of comparison between the first current and the second current.

BRIEF DESCRIPTION OF THE SEVERAL VIEWS OF THE DRAWING

FIG. 5 is a circuit diagram showing an example of the construction in a case where a fuse element in the circuit of FIG. 3 is realized;

FIG. 6 is a diagram showing the relation between a signal whose level is set according to the fail number which is desired to be detected and the fail number which can be detected;

FIG. 7 is a timing chart showing a case wherein the fail number is detected in the circuit shown in FIG. 3;

FIG. 11 is a diagram showing the fail numbers of I/O0 to I/O7, for illustrating the operation for detecting the fail number for each I/O.

DETAILED DESCRIPTION OF THE INVENTION

[First Embodiment]

Figure 3:
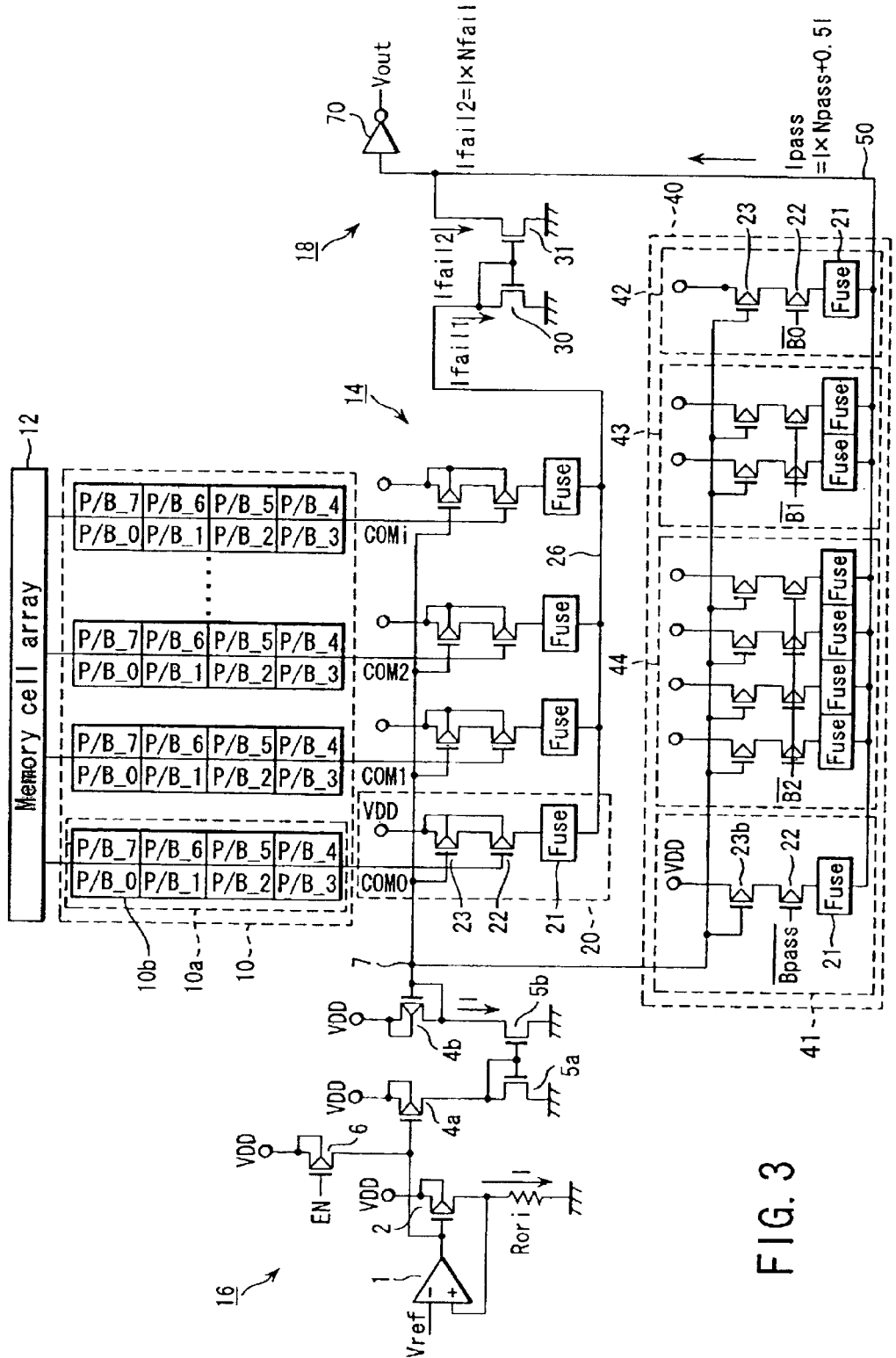
FIG. 3 is a circuit diagram showing an extracted fail number detecting circuit of a flash memory and an extracted circuit section which is associated with the above circuit, for illustrating a semiconductor memory device according to a fist embodiment of this invention.

FIG. 3 shows an extracted fail number detecting circuit of a flash memory and an extracted circuit section which is associated with the above circuit, for illustrating a semiconductor memory device according to a fist embodiment of this invention. The circuit includes a memory cell array 12, register (page buffer P/B) group 10 of one page, current passage circuit group 14, permissible fail number setting circuit 40, fixed voltage generating circuit 16 and comparing circuit 18.

Figure 1:
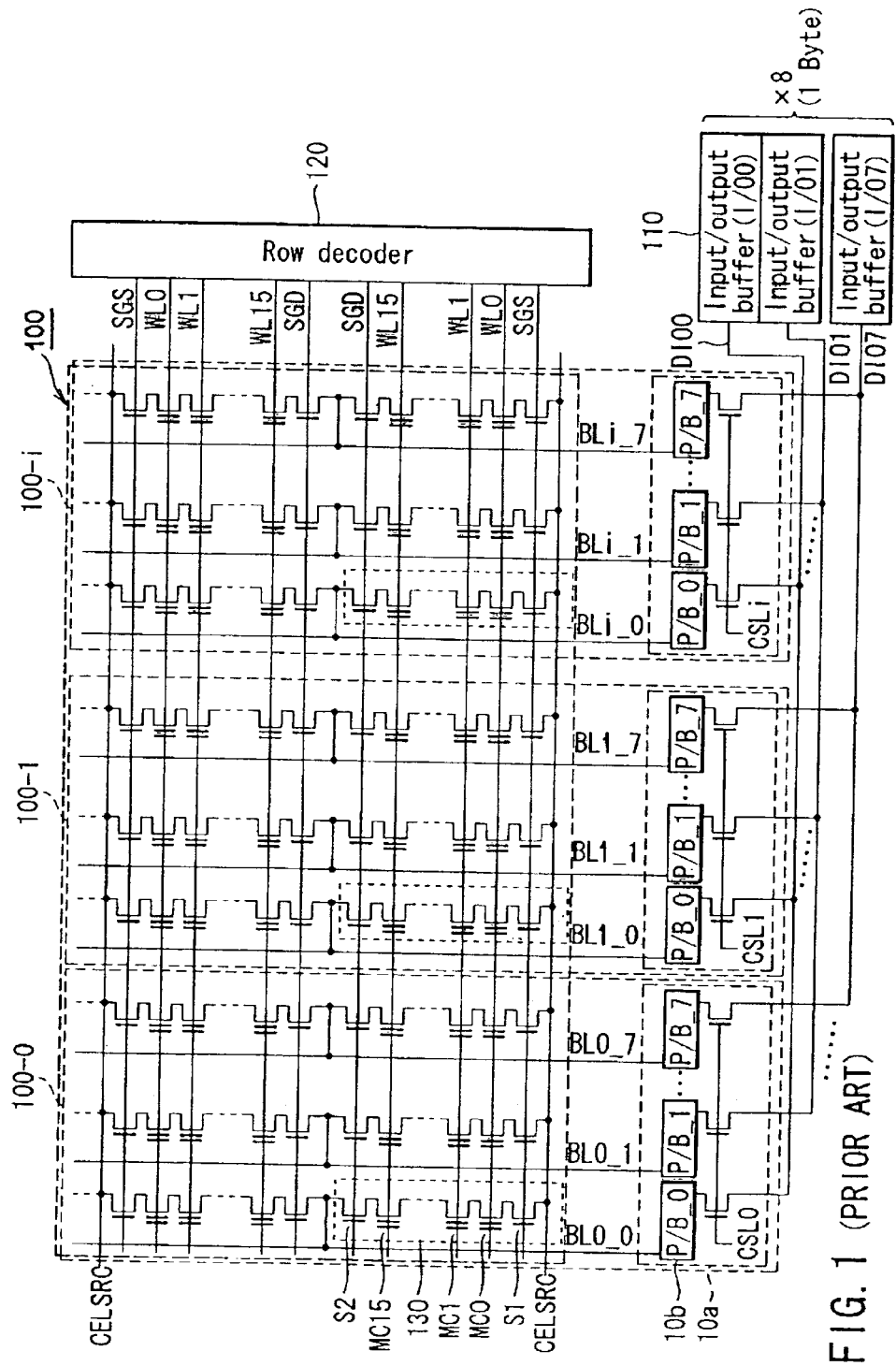
FIG. 1 is a block diagram showing a core section of a NAND flash memory, for illustrating a first conventional method for detecting the fail number in a semiconductor memory device.
Figure 2:
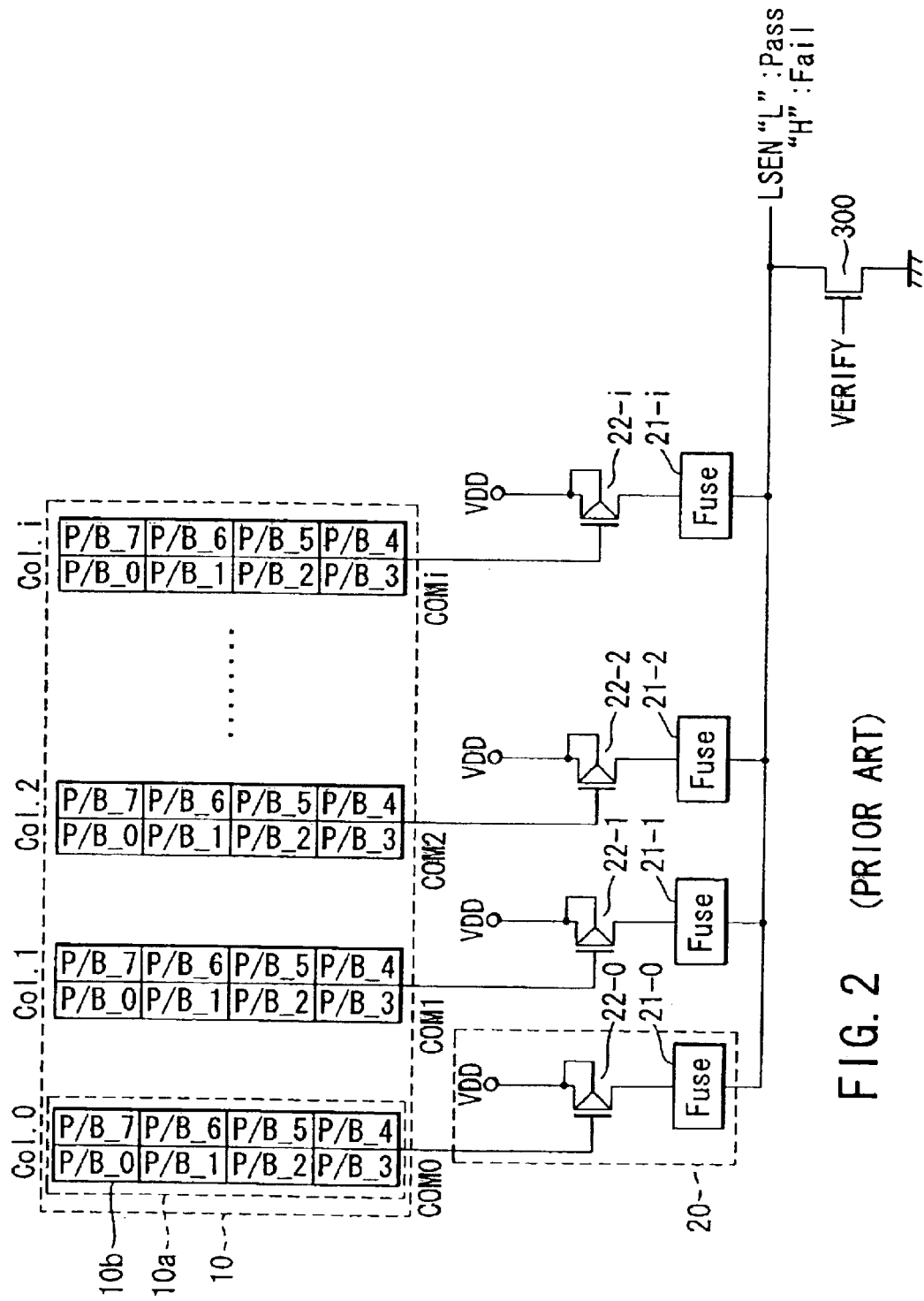
FIG. 2 is a circuit diagram schematically showing an extracted circuit section which detects output nodes of registers in one page based on the OR logic, for illustrating a second conventional method for detecting the fail in the semiconductor memory device.

The memory cell array 12 is formed with the same construction as that shown in FIG. 1, and in the memory cell array 12, electrically rewritable nonvolatile memory cells are arranged in a matrix form.

In the register group 10, one-column (one-byte) register groups 10a are provided for respective columns. In each of the register groups 10a, registers 10b (registers P/B_0 to P/B_7 corresponding to data input/output buffers I/O0 to I/O7) which hold verify results are contained.

The current passage circuit group 14 includes circuit sections (current passage circuits) 20. The group 14 generates currents varying in proportion to "1" or "0" of binary logical data of one-side ends of the respective registers 10b. In each of the current passage circuits 20, a fuse element 21 and PMOS transistors 22, 23 are contained. The fuse element 21 and the current paths of the PMOS transistors 22, 23 are serially connected between a common node 26 and a power supply node VDD. The gate of the PMOS transistor 22 is connected to a COMj ($0 \leq i \leq j$) and the gate of the PMOS transistor 23 is connected to the output terminal (node 7) of the fixed voltage generating circuit 16.

The permissible fail number setting circuit 40 is formed with a D/A converter configuration and includes current passage circuits 41, 42, 43, 44. The current passage circuits 41, 42, 43, 44 are provided so that the output current of the permissible fail number setting circuit 40 can be changed and the output current can be set in the same steps of current as the steps of an increasing or decreasing current of the current passage circuit group 14. The current passage circuit 41 includes a fuse element 21 and PMOS transistors 22, 23b. The fuse element 21 and the current paths of the PMOS transistors 22, 23b are serially connected between a common node 50 and the power supply node VDD. A signal $\overline{Bpass}$ is applied to the gate of the PMOS transistor 22 and the gate of the PMOS transistor 23b is connected to the output terminal of the fixed voltage generating circuit 16. The current passage circuit 42 includes a fuse element 21 and PMOS transistors 22, 23. The fuse element 21 and the current paths of the PMOS transistors 22, 23 are serially connected between the common node 50 and the power supply node VDD. A signal $\overline{B0}$ is supplied to the gate of the PMOS transistor 22 and the gate of the PMOS transistor 23 is connected to the output terminal of the fixed voltage generating circuit 16. The current passage circuit 43 has a construction obtained by connecting two current passage circuits each corresponding to the current passage circuit 42 in parallel and a signal $\overline{B1}$ is supplied to the gates of the PMOS transistors 22. The current passage circuit 44 has a construction obtained by connecting four current passage circuits each corresponding to the current passage circuit 42 in parallel and a signal $\overline{B2}$ is supplied to the gates of the PMOS transistors 22.

The fixed voltage generating circuit 16 includes PMOS transistors 2, 4a, 4b, 6, NMOS transistors 5a, 5b and resistor Rori. Reference voltage Vref is applied to the inverting input terminal (−) of a differential amplifier 1 whose output terminal is connected to the gates of the PMOS transistors 2, 4a and one end of the current path of the PMOS transistor 6. One end of the current path of the PMOS transistor 2 is connected to the power supply node VDD and the other end thereof is connected to one end of the resistor Rori and the non-inverting input terminal (+) of the differential amplifier 1. The other end of the resistor Rori is grounded and a current I is caused to flow in the resistor Rori. The other end of the current path of the PMOS transistor 6 is connected to the power supply node VDD and an enable signal EN is supplied to the gate thereof. One-side ends of the current paths of the PMOS transistors 4a, 4b are connected to the power supply node VDD and the other ends of the current paths thereof are connected to the NMOS transistors 5a, 5b having a current mirror circuit configuration. The gate and the other end of the current path of the NMOS transistor 4b are commonly connected (node 7) and a current I which is the same as the current I flowing in the resistor Rori from the PMOS transistor 2 is caused to flow in the current path thereof.

The comparing circuit 18 includes NMOS transistors 30, 31 and inverter 70. The comparing circuit 18 compares a current Ifail1 (=Ifail2=I×Nfail) generated from the current passage circuit group 14 with a current Ipass (=I×Npass+0.5I) generated from the permissible fail number setting circuit 40 and outputs the result of comparison (Vout).

Figure 4:
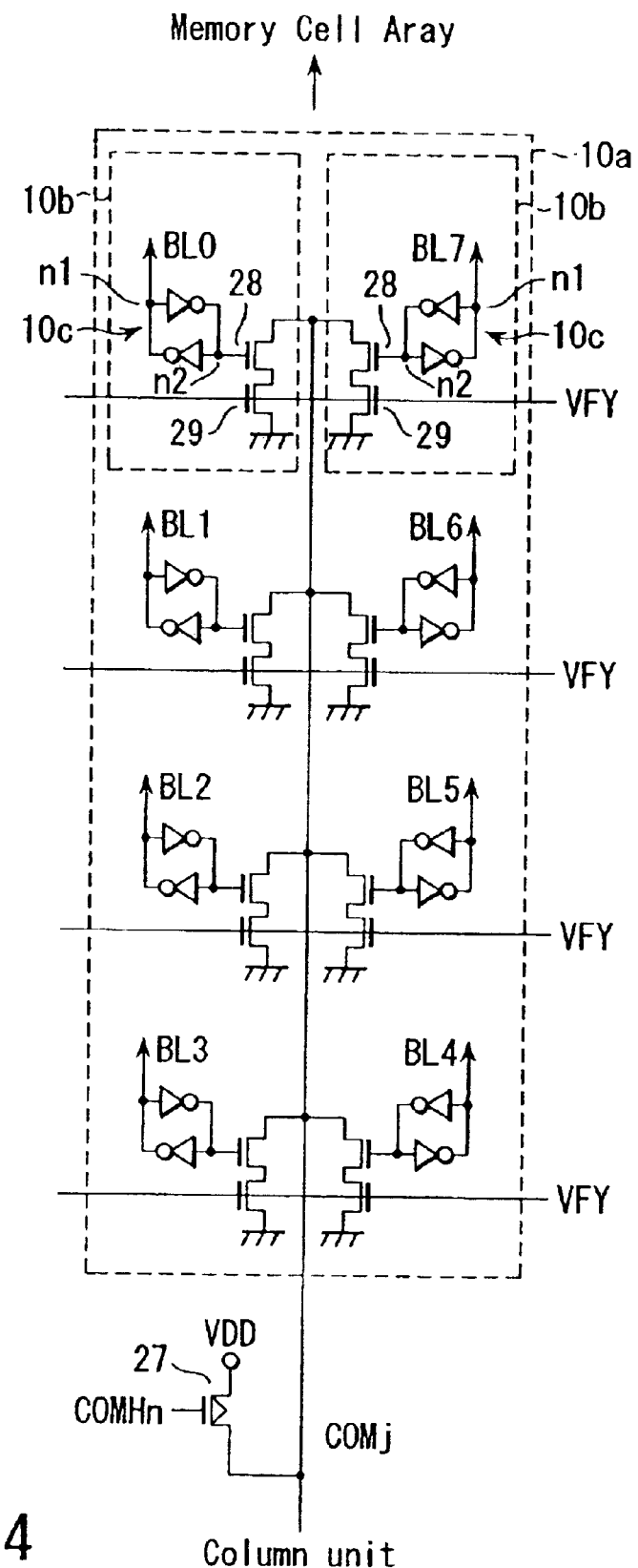
FIG. 4 is a circuit diagram specifically showing the connection between registers and a node in part of the circuit shown in FIG. 3 when detection is made in the unit of column.

With the above construction, after verify readout of the program operation or verify readout of the erase operation, pass/fail data is output to the signal lines (nodes) COM0, COM1, ..., COMi of the respective columns. A signal line COMj which is one of the above signal lines is extracted and an example of the specific construction thereof is shown in FIG. 4. In FIG. 4, a case wherein the fail number is detected in the column unit is shown.

As shown in FIG. 4, a latch circuit 10c is provided in one register 10b, a node n1 of one end thereof is connected to a corresponding one of bit lines BL0, BL1, BL2, ..., where BL0, BL1, BL2 ... are corresponding to BLj_0, BLj_1, BLj_2, ... in FIG. 1, respectively at the time of program operation or readout operation and the other node n2 is connected to the gate of an NMOS transistor 28 of the register 10b. The latch circuit 10c temporarily holds program data or readout data in a NAND flash memory. In the programming operation, the result of the program verify readout operation is also used as next program data. A signal VFY is input to the gate of an NMOS transistor 29 whose current path is serially connected to the NMOS transistor 28.

At the time of the fail number detecting operation, a signal COMHn is first set to the "L" level, and after the signal line COMj is precharged to the "H" level (VDD) by use of a PMOS transistor 27, the signal VFY is set to the "H" level. If the verify readout result corresponds to pass data, the potential of the node n2 is set to the "L" level and if it corresponds to fail data, the potential of the node n2 is set to the "H" level. When the pass state is held in all of the latch circuits 10c of the register group 10a as the result of verify readout, the signal line COMj will not be discharged since all of the nodes n2 are set at the "L" level, but if a latch circuit which holds fail data is provided even in one portion, the potential of the signal line COMj is discharged to the "L" level via the current paths of the NMOS transistors 28, 29. That is, in the circuit of FIG. 3, the PMOS transistor 22 is made conductive in a column containing fail data.

Preset fixed voltage which is controlled by the differential amplifier 1 is kept applied to the gate of the PMOS transistor 23 from the node 7. The differential amplifier 1 is operated so as to set the potential of the connection node of the resistor element Rori and the current path of the PMOS transistor 2 to Vref. By the above operation of the differential amplifier 1, a current I (=Vref/Rori) flows in the resistor Rori and the differential amplifier 1 outputs such a gate voltage that causes the PMOS transistor 2 to supply the current I. For example, the reference voltage Vref is set at a voltage of approx. 1 V. Fixed voltage is applied to the node 7 by use of the PMOS transistors 4a, 4b and NMOS transistors 5a, 5b so as to permit the PMOS transistor 23 to supply the current I.

The PMOS transistors 2, 4a, 4b and PMOS transistor 23 of each column shown in FIG. 3 are transistors of the same size. Therefore, if the PMOS transistor 22 is set in the conductive state in the current path of each column and the fuse element 21 is not melted or not cut off the current I flows towards the common node 26. That is, the current I flows in the column containing fail data.

A current mirror circuit configured by NMOS transistors 30, 31 is connected to the common node 26, a current Ifail1 varying in proportion to the number of columns containing fail data flows in the diode-connected NMOS transistor 30 and such a voltage as to cause a current which is the same as Ifail1 to flow in the NMOS transistor 31 is applied to the gate of the NMOS transistor 31. A current Ifail2 flowing in the NMOS transistor 31 becomes substantially equal to the current Ifail1 when the NMOS transistor 31 is operated in a pentode operation region.

The permissible fail number setting circuit 40 having a D/A converter configuration is connected to the drain (node 50) of the NMOS transistor 31. In a current passage circuit 41 of the circuit 40, the gate size of a PMOS transistor 23b is set equal to half the gate size of the PMOS transistor 23, but in the other current passage circuits 42, 43, 44, PMOS transistors and fuse elements used therein are the same as those of the current path 20.

Thus, a current 0.5I which is 0.5 times the current I caused to flow by the PMOS transistor 2 will flow in the current passage circuit 41, a current I which is the same as that flowing in the current passage circuit 20 will flow in the current passage circuit 42, a current 2I will flow in the current passage circuit 43 and a current 4I will flow in the current passage circuit 44.

The fuse elements 21 used in the current paths 20, 41, 42, 43, 44 may be formed of laser blow type fuses or switching circuits with the circuit construction in which the gate potential of a MOS transistor 200 is controlled by the potential of a node 201 at one end of the latch circuit as shown in FIG. 5. In the example shown in FIG. 5, it is preferable to construct the transistor 200 whose gate is controlled by the potential of the node 201 at one end of the latch circuit by use of a PMOS transistor in accordance with the construction of the current path 20. It is also possible to construct the transistor 200 by use of an NMOS transistor, but in this case, it becomes necessary to prevent the transistor 200 from limiting a current which is desired to flow in the current path 20. Further, if one of gate signals GA and GB of NMOS transistors 203 and 204 connected to the latch circuit is used as a reset signal, the other signal is used as a signal which is controlled according to an address corresponding to an address of a defective column, and in this case, the state equivalent to that in which the fuse is cut off is attained by making the transistor 200 nonconductive.

Signals $\overline{B0}$, $\overline{B1}$, $\overline{B2}$ supplied to the current passage circuits 42, 43, 44 are signals whose levels are set according to the fail numbers to be detected. A current Ipass to be caused to flow from the permissible fail number setting circuit 40 is determined according to the levels of the signals $\overline{B0}$, $\overline{B1}$, $\overline{B2}$ and the operating point potential of the node 50 is determined by the current Ipass and current Ifail2 which is caused to flow from the NMOS transistor 31. In FIG. 3, the potential is detected by use of the inverter 70 and an output voltage Vout is obtained.

The relation between the signals B0, B1, B2 and the fail number which can be detected is shown in FIG. 6. The signals B0, B1, B2 are inverted signals of $\overline{B0}$, $\overline{B1}$, $\overline{B2}$, respectively. In a case where (B2, B1, B0) is (0, 0, 0), the current Ipass which can be caused to flow by the permissible fail number setting circuit 40 becomes 0.5×I. At this time, since the current Ifail1 becomes "0" if all of the registers P/B in FIG. 3 hold pass data obtained as the result of verify readout, that is, if all of the signal lines COM0 to COMi are set at the "H" level, the operating point of Ifail2=0 and Ipass=0.5I is shifted to the "H" level side and the output voltage Vout is set to the "L" level. Further, if one column containing the register P/B which holds fail data is present, one signal line COMj is set to the "L" level and Ifail1 becomes equal to I so that the operating point voltage of Ifail2=I and Ipass=0.5I will be shifted to the "L" level side and the output voltage Vout is set to the "H" level. That is, in a case where (B2, B1, B0) is (0, 0, 0), it becomes possible to detect that at least one column which contains fail data is present.

Likewise, since Ipass becomes 1.5I in a case where (B2, B1, B0) is (0, 0, 1), it becomes possible to detect by the batch processing operation that two or more columns which contain fail data are present.

If an increment control operation for the permissible fail number setting signals B0, B1, B2 is effected in addition to the above operation, it becomes possible to detect the number of columns which contain fail data. That is, as shown in FIG. 7, if (B2, B1, B0) is incremented from (0, 0, 0) to (0, 0, 1), (0, 1, 0) while the current Ifail1 corresponding to the register having fail data is kept to flow, the output voltage Vout is inverted when the current Ipass corresponding to (B2, B1, B0) exceeds the current Ifail1. Therefore, it can be detected that fails of the number corresponding to (B2, B1, B0) at the time of inversion of the output voltage Vout are present. In the example of the timing chart of FIG. 7, since the output voltage Vout is inverted to the "L" level at the time of (B2, B1, B0)=(0, 1, 1), it is understood that three columns containing fail data are present.

That is, in the first embodiment, the presented current I fail is caused to flow based on the terminated/non-terminated state of the program, erase operation of each memory cell in the batch processing unit in order to detect whether or not the memory cells are set into a preset data holding state and the number of preset non-terminated states in the batch processing operation is detected by detecting the total amounts of currents in the batch processing unit by the A/D converter operation.

Figure 8A:
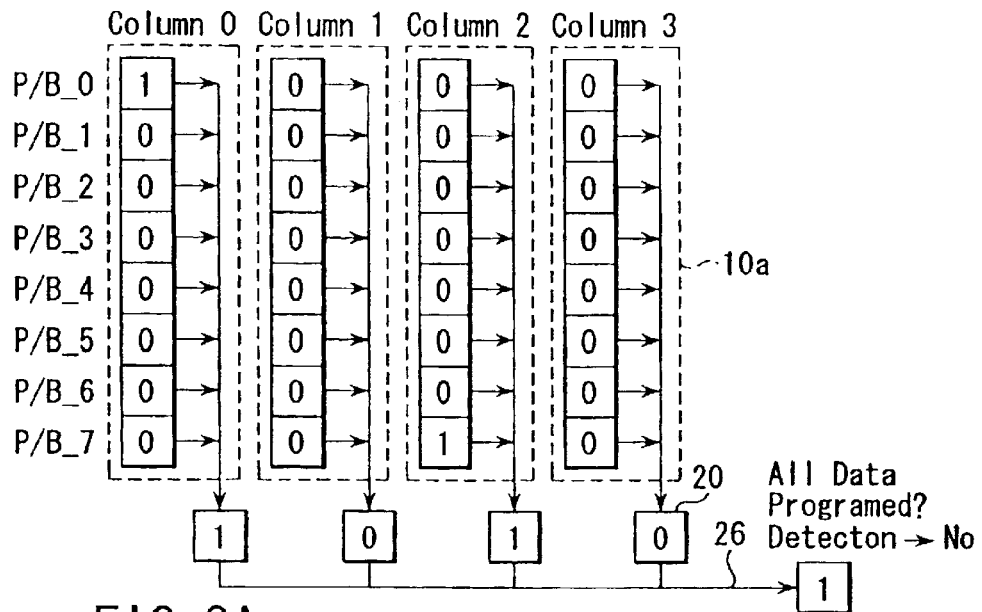
FIG. 8A is a diagram showing the conventional detecting operation, for illustrating the fail number detecting operation in the column unit.
Figure 8B:
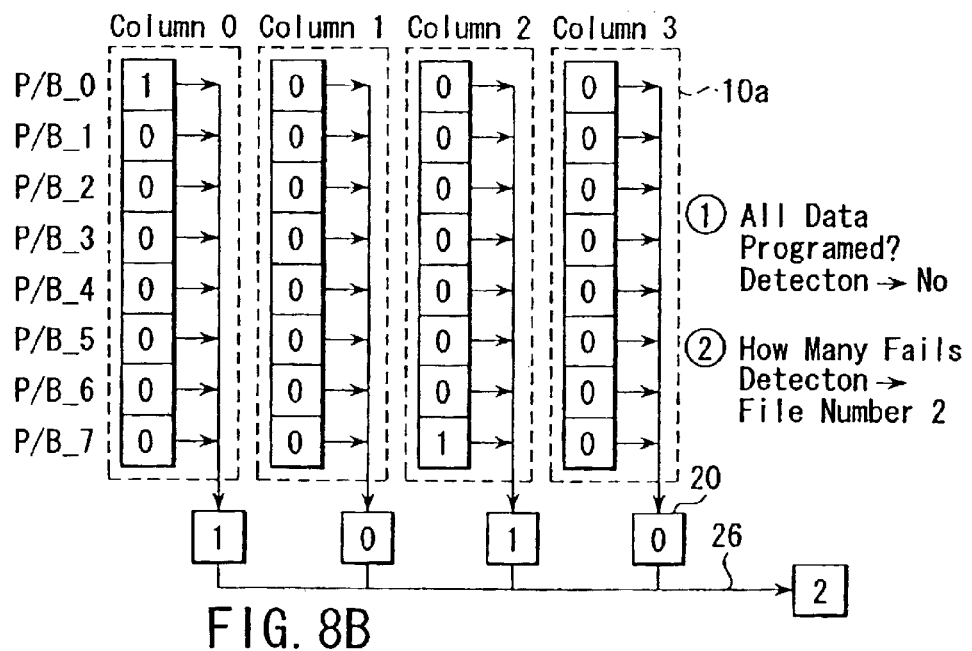
FIG. 8B is a diagram showing the detecting operation according to the first embodiment of this invention, for illustrating the fail number detecting operation in the column unit.

FIGS. 8A and 8B are diagrams showing the conventional batch detecting operation and the operation of the present embodiment. That is, as shown in FIG. 8A, conventionally, since whether the common node 26 is charged or discharged is detected, it is only detected that a fail occurs even if two columns 10a containing the registers P/B which hold fail data are present. However, as shown in FIG. 8B, the present embodiment can cope with both of the batch detecting method for detecting two or more columns which have failed and the detecting method for detecting the number of columns which have failed.

In a case where the fail number is counted, it is necessary to check the output while sequentially incrementing (B2, B1, B0) as shown in FIG. 7, but the number of above operations may be set approximately equal to the number of redundancy columns provided in each of the cell arrays and used instead of defective columns. Therefore, for example, if eight redundancy columns are provided in the cell array, four bits such as (B3, B2, B1, B0) or three bits may be used, the operations may be effected only by approx. 10 times and it does not take such a long time as required for performing the readout operation for all of the registers P/B in the page.

Thus, the reason why fail data after the verify readout operation is not used to detect the number of fail bits but used to detect the number of columns (one column is eight bits in the case of eight I/Os) each containing a fail bit is that it is equal to the replacement unit of column redundancy in the case of the first embodiment.

If one of the eight latch circuits contained in one column corresponds to a defective cell or defective bit line or when it is required to replace the latch circuit by a redundancy circuit because the latch circuit itself becomes defective, all of the eight latch circuits are replaced by redundancy circuits even if the other seven latch circuits or memory cells corresponding to the other seven latch circuits are normal. Therefore, a test can be made even before cutting off the fuse element of the defective column by detecting the number of columns containing fail bits after verify and checking whether the thus detected column number is equal to the number of defective columns to be replaced in the test process for checking the number of repetitions of the program pulse applying operation and the verify readout operation, for example.

Further, in the erase operation, a plurality of NAND cells (each NAND cell includes a plurality of memory cells which are serially connected) called a block are simultaneously subjected to the erase process in the NAND flash memory. In the erase verify operation effected after the erase pulse applying operation, the verify result of the NAND cell is held in a contracted configuration in the individual registers 10$b$ of the register group 10$a$ of one byte. That is, data of a plurality of memory cells in the NAND cell makes one-bit data and is held in the register 10$b$. Therefore, like the case of the process after program verify, the number of columns containing failed data is detected.

A case wherein the number of fail columns holding fail data after verify readout which is held in the latch circuit 10$c$ provided in each of the registers P/B can be detected is explained above, but data to be detected may have no relation to pass/fail and the detecting operation can be regarded as an operation for detecting the total number of "0" or "1" of binary logic data held in the latch circuit.

Therefore, it becomes possible to detect whether or not all of the memory cells are set into a preset data holding state in the batch processing operation of short time period and detect whether or not all of the verify readout results have passed in addition to the fail number at high speed.

[Second Embodiment]

Figure 9:
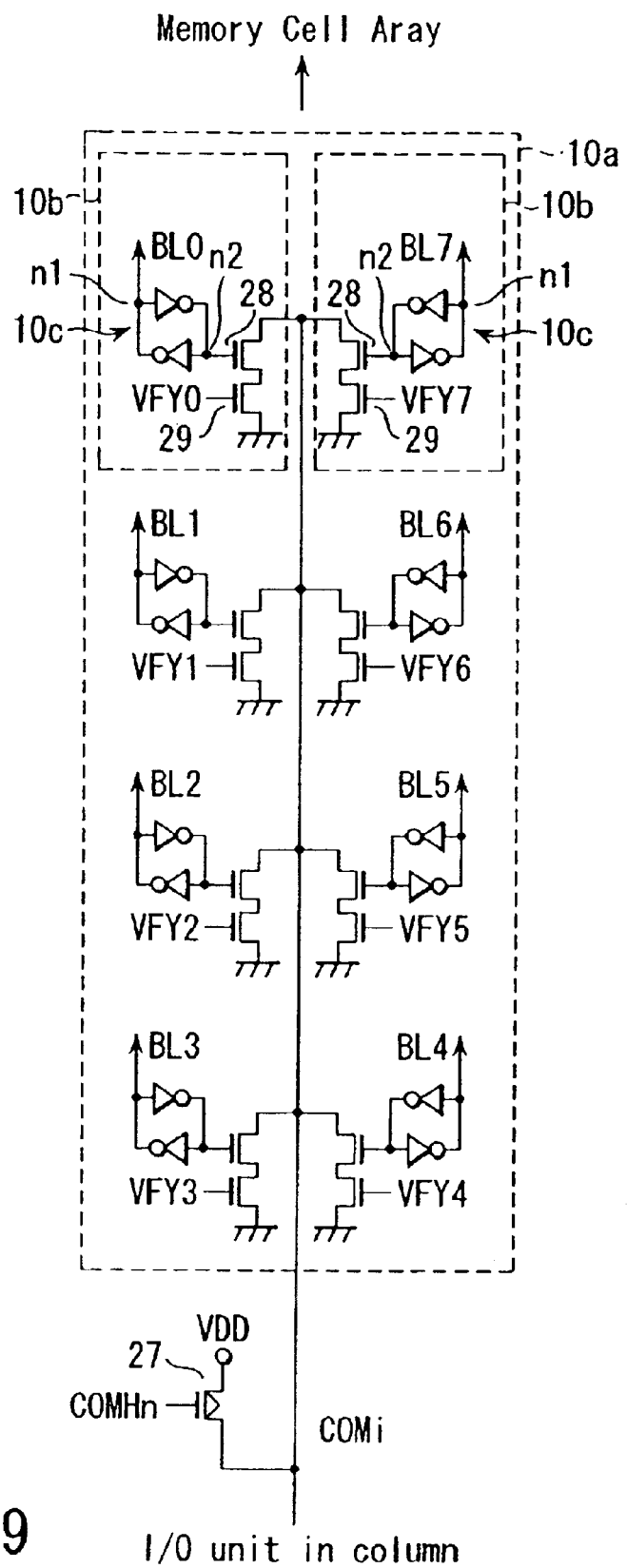
FIG. 9 is a circuit diagram specifically showing the connection between registers and a node in part of the circuit shown in FIG. 3 when detection is made in the unit of I/O in the column, for illustrating a semiconductor memory device according to a second embodiment of this invention.

In the first embodiment described above, a case wherein the number of columns each containing fail data or a register (page buffer) P/B having "1" data on the node n2 of the latch circuit is detected is explained, but if the register group 10$a$ of each column is replaced by a circuit having a configuration as shown in FIG. 9, the number of fail data items or registers P/B each having "1" data on the node n2 of the latch circuit can be detected irrespective of the column unit.

That is, in the circuit shown in FIG. 9, different signals VFY0 to VFY7 are supplied to the gates of NMOS transistors 29 of the respective registers 10$b$.

Figure 10A:
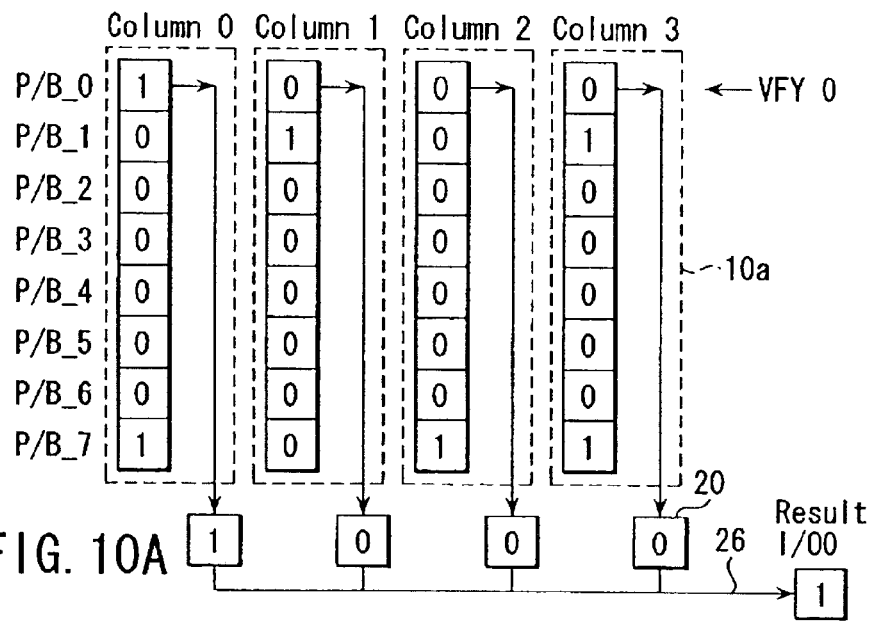
FIG. 10A is a diagram showing the fail number of I/O0, for illustrating the operation for detecting the fail number for each I/O.
Figure 10B:
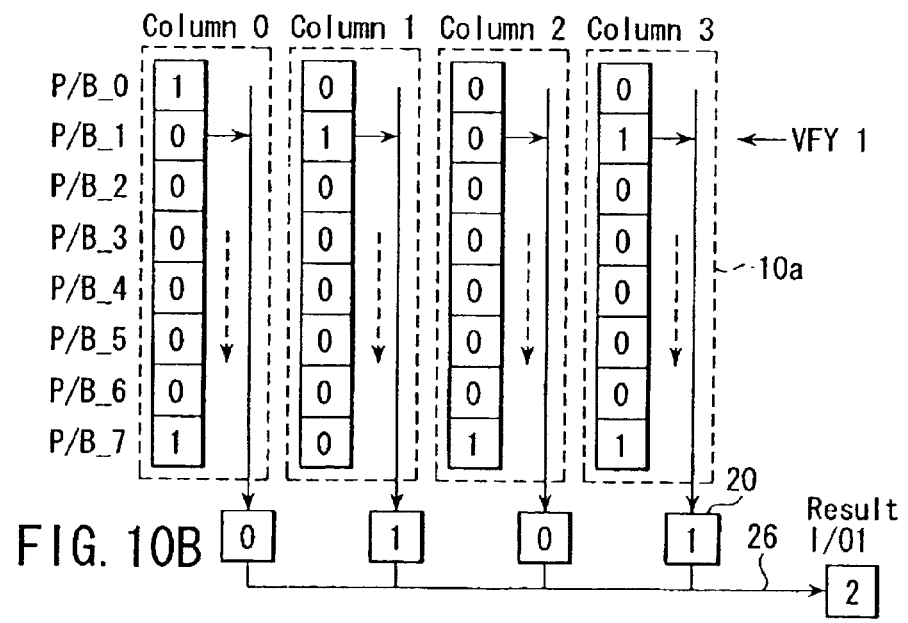
FIG. 10B is a diagram showing the fail number of I/O1, for illustrating the operation for detecting the fail number for each I/O.

Next, the operation of the circuit shown in FIG. 9 is explained with reference to FIGS. 10A, 10B and 11. In FIGS. 10A and 10B, numerals in the P/B group 10$a$ of each column express data items ("1" indicates "fail" and "0" indicates "pass") which the registers P/B_0 to P/B_7 hold.

First, as shown in FIG. 10A, the signal VFY0 is set to the "H" level and the pass/fail result of the register P/B_0 corresponding to I/O0 is output to the signal line COMj. After this, the number of fails contained in P/B_0 in the page can be detected by performing the fail number detecting operation. For example, one fail is present in the page in P/B_0.

After the number of fails in P/B_0 is detected, as shown in FIG. 10B, the signal VFY1 is set to the "H" level, then pass/fail data of the register P/B_1 is output to the signal line COMj and the fail number detecting operation is effected in the same manner as described above. Two fails are present in the page in P/B_1.

In the same manner as described above, if the same operation is effected up to P/B_7, the number of fails of each I/O and the total number thereof can be easily derived as shown in FIG. 11.

The first embodiment relates to the column redundancy, but the second embodiment relates to an error code correction function (ECC). That is, it is assumed that program fails of several bits can be permitted by the ability of the error code correction function of the system using the semiconductor memory. If verify fails of several bits are permitted in the program operation, an operation which detects the number of thus failed bits is effective and can be performed at higher speed in comparison with the conventional case.

[Third Embodiment]

Figure 12:
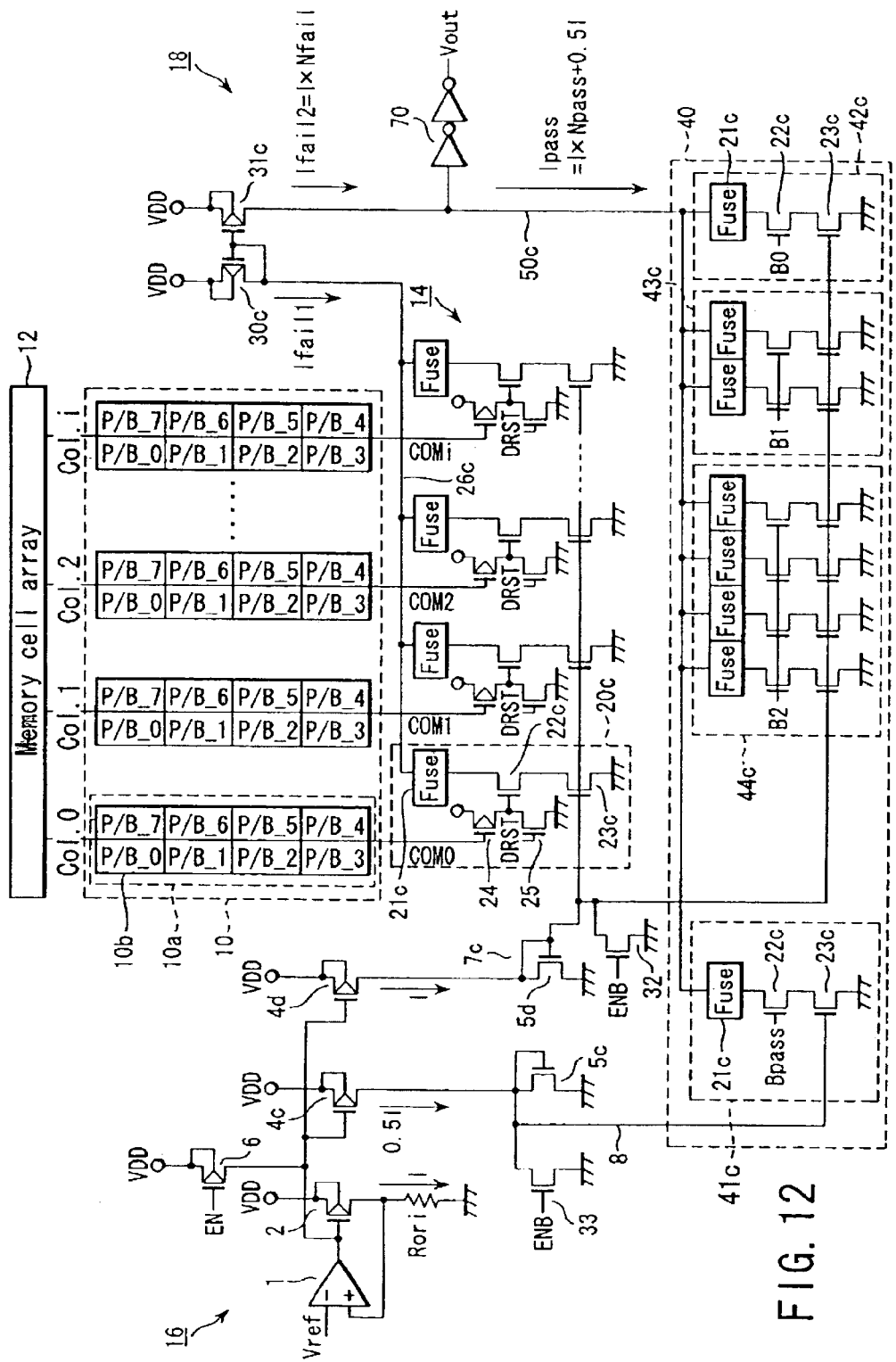
FIG. 12 is a circuit diagram showing an extracted fail number detecting circuit of a flash memory and an extracted circuit section which is associated with the above circuit, for illustrating a semiconductor memory device according to a third embodiment of this invention.

FIG. 12 illustrates a semiconductor memory device according to a third embodiment of this invention and shows a modification of the construction of the circuit shown in FIG. 3. In FIG. 12, portions which are the same as those of FIG. 3 are denoted by the same reference numerals and the detail explanation thereof is omitted.

In the first embodiment shown in FIG. 3, the constant current flowing in each of the columns is determined by the PMOS transistor 23, but in the third embodiment shown in FIG. 12, it is determined by use of an NMOS transistor 23$c$.

A portion which determines the current I is the same as in the circuit portion of FIG. 3, but a current of 0.5I is generated by use of a PMOS transistor 4$c$ and the gate potential of a diode-connected NMOS transistor 5$c$ is input to a permissible fail number setting circuit 40. Further, the construction is made to cause a current I to flow in a PMOS transistor 4$d$ and cause the current I to flow in a current passage circuit 20$c$ of each column by use of a diode-connected NMOS transistor 5$d$. In this case, the potentials of nodes 7$c$ and 8 are different, but the nodes are supplied with stable voltages in an operation period except the initial period of the circuit operation.

Further, enable signals EN and ENB which set the circuit into a non-active state are respectively supplied to the gates of a PMOS transistor 6 and NMOS transistors 32, 33 so as to interrupt current flowing paths in the non-active state.

Pass/fail signals output from the registers P/B to signal lines COM0, COM1, . . . COMi are respectively input to the gates of PMOS transistors 24 and the drain potential of each PMOS transistor 24 is input to the gate of a corresponding one of NMOS transistors 22$c$. Each NMOS transistor 25 having a gate to which a signal DRST is input is used for resetting the gate potential of a corresponding one of the NMOS transistors 22$c$. Therefore, when the potential of the signal line COMj is set at the "L" level, an "H" level potential is applied to the gate of the NMOS transistor, and when the potential of the signal line COMj is set at the "H" level, an "L" level potential indicating the reset state is kept applied to the gate of the NMOS transistor 22$c$.

In the third embodiment, as a method for generating the current 0.5I in the permissible fail number setting circuit 40, a method for setting the gate width of the PMOS transistor 4$c$ to half the gate width of the PMOS transistor 4$d$ so as to set a current flowing in the PMOS transistor 4$c$ to 0.5I is shown, but it is possible to use a method for setting the gate widths of the PMOS transistors 4$c$ and 4$d$ equal to each other and setting the gate width of the NMOS transistor 5$c$ to twice the gate width of the NMOS transistor 5$d$ or 23$c$. Further, it is possible to cause a current of 0.5I to flow on the current passage circuit 41 or 41$c$ side by use of the method shown in FIG. 3.

Further, with the above circuit construction, if fuse elements 21$c$ are each formed with the circuit construction as shown in FIG. 5, it is preferable to form a transistor 200 by use of an NMOS transistor.

As described above, according to one aspect of this invention, a semiconductor memory device can be provided which has a detecting circuit capable of detecting whether or not all of the memory cells are set into a preset data holding state in the batch processing operation of short time period.

Further, a semiconductor memory device can be provided which has a detecting circuit capable of detecting whether or not all of the verify readout results have passed and detecting the fail number at high speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a memory cell array having NAND cells arranged therein;
    a plurality of latch circuits which temporarily hold data read out from said memory cell array;
    a first circuit configured to generate a first current varying in proportion to "1" or "0" of binary logic data of one end of said plurality of latch circuits;
    a second circuit configured to generate a second current which is preset; and
    a third circuit configured to compare the first current with the second current;
    wherein the value of "1" or "0" of binary logic data of said one end of said plurality of latch circuits is detected based on result of the comparison between the first current and the second current.

2. The semiconductor device according to claim 1, wherein an output current of said second circuit is variable and can be set to vary in the same steps as the steps in which the first current varies.

3. The semiconductor device according to claim 1, wherein the minimum value of the second current is larger than the minimum value of the first current and the maximum value of the second current is smaller than the maximum value of the first current.

4. The semiconductor device according to claim 1, wherein said third circuit includes a first MOS transistor which is diode-connected to cause the first current to flow there through, and a second MOS transistor having a gate potential equal to a gate potential of said first MOS transistor and having a drain connected to said second circuit.

5. The semiconductor device according to claim 1, wherein data read out from said memory cell array is data obtained after a verify readout is performed in one of a program operation and erase operation.

6. The semiconductor device according to claim 1, wherein the value "1" or "0" detected from said one end of said plurality of latch circuits is equal to the number of failed bits after a verify readout of a program operation is performed.

7. The semiconductor device according to claim 1, wherein
    said first circuit includes a plurality of current passage circuits connected in parallel, each including a first MOS transistor having a gate applied with a preset fixed potential, a second MOS transistor having a current path serially connected to a current path of said first MOS transistor and having a gate potential directly or indirectly controlled based on a potential of said one end of said plurality of latch circuits and a first switching element connected in series with the current paths of said first and second MOS transistors; and
    said second circuit includes plurality of current passage circuits each including a third MOS transistor which is the same size as said first MOS transistor and having a gate applied with the fixed potential, a fourth MOS transistor having a current path serially connected to a current path of said third MOS transistor and having a gate controlled by a control signal used for setting a second current value and a second switching element connected in series with the current paths of said third and fourth MOS transistors, and a current passage circuit configured to generate a current smaller than the current which has a value smaller than that of one of the plurality of current passage circuits of said first circuit.

8. The semiconductor device according to claim 7, wherein said first and second switching elements include fuse elements.

9. The semiconductor device according to claim 7, wherein said first and second switching elements include MOS transistors having gates which are controlled.

10. A semiconductor device comprising:
    a memory cell array having NAND cells arranged therein;
    a plurality of latch circuits which temporarily hold data to be programmed into said memory cell array;
    a first circuit configured to generate a first current varying in proportion to "1" or "0" of binary logic data of one end of said plurality of latch circuits;
    a second circuit is configured to generate a second current which is preset; and
    a third circuit configured to compare the first current with the second current;
    wherein the value of "1" or "0" of binary logic data of said one end of said plurality of latch circuits is detected based on result of the comparison between the first current and the second current.

11. The semiconductor device according to claim 10, wherein an output current of said second circuit is variable and can be set to vary in the same steps as the steps in which the first current varies.

12. The semiconductor device according to claim 10, wherein the minimum value of the second current is larger than the minimum value of the first current and the maximum value of the second current is smaller than the maximum value of the first current.

13. The semiconductor device according to claim 10, wherein said third circuit includes a first MOS transistor which is diode-connected to cause a first current to flow there through, and a second MOS transistor whose gate potential is equal to that of said first MOS transistor and whose drain is connected to said second circuit.

14. The semiconductor device according to claim 10, wherein the value of "1" or "0" detected from said one end of said plurality of latch circuits is equal to the number of program data items accompanied by a shift in a threshold voltage in a program operation.

15. The semiconductor device according to claim 10, wherein
    said first circuit includes a plurality of current passage circuits connected in parallel, each including a first MOS transistor having a gate applied with a preset fixed potential, a second MOS transistor having a current path serially connected to a current path of said first MOS transistor and having a gate potential directly or indirectly controlled based on a potential of said one end of said plurality of latch circuits, and a first switching element connected in series with the current paths of said first and second MOS transistors; and said second circuit includes a plurality of current passage circuits each including a third MOS transistor which is the same size as said first MOS transistor and having a gate applied with the fixed potential, a fourth MOS transistor having a current path serially connected to a current path of said third MOS transistor and having a gate controlled by a control signal used for setting a second current value and a second switching element connected in series with the current paths of said third and fourth MOS transistors, and a current passage circuit configured to generate a current which has a value smaller than that of one of the plurality of current passage circuits of said first circuit.

16. The semiconductor device according to claim 15, wherein said first and second switching elements include fuse elements.

17. The semiconductor device according to claim 15, wherein said first and second switching elements include MOS transistors having gates which are controlled.

18. A semiconductor device comprising:
a memory cell array having NAND cells arranged therein;
a plurality of latch circuit groups each including a preset number of latch circuits which temporarily hold data read out from said memory cell array;
a first circuit configured to cause a current to flow through a current path connected to a corresponding latch circuit group of the plurality of the latch circuit groups when binary logic data of one end of said plurality of latch circuit groups is "0", and interrupt the current when the binary logic data is "1", said first circuit outputting a first current which is a sum of currents flowing through the current path;
a second circuit configured to generate a second current which is preset; and
a third circuit configured to compare the first current output from the first circuit with the second current output from the second circuit, said third circuit detecting the value of "1" or "0" of binary logic data of said one end of the plurality of latch circuit groups based on a result of the comparison between the first current and the second current.

19. The semiconductor device according to claim 18, wherein said plurality of latch circuit groups each include a least a sense amplifier or a data register simultaneously selected by a column address.

20. The semiconductor device according to claim 18, wherein the value of "1" or "0" detected from said one end of said plurality of latch circuit groups is equal to the number of failed bytes after a verify readout of a program operation is performed.

21. The semiconductor device according to claim 18, wherein an output current of said second circuit is variable and can be set to vary at the same interval as an interval at which the first current varies.

22. The semiconductor device according to claim 18, wherein the minimum value of the second current is larger than the minimum value of the first current and the maximum value of the second current is smaller than the maximum value of the first current.

23. The semiconductor device according to claim 18, wherein said third circuit includes a first MOS transistor which is diode-connected to cause a first current to flow there though, and a second MOS transistor having a gate potential equal to a gate potential of said first MOS transistor and having a drain connected to said second circuit.

24. The semiconductor device according to claim 18, wherein
said first circuit includes a plurality of current passage circuits connected in parallel, each including a first MOS transistor having a gate applied with a preset fixed potential, a second MOS transistor having a current path serially connected to a current path of said first MOS transistor and having a gate potential directly or indirectly controlled based on a potential of said one end of said plurality of latch circuits and a first switching element connected in series with the current paths of said first and second MOS transistors; and said second circuit includes a plurality of current passage circuits each including a third MOS transistor which is the same size as said first MOS transistor and having a gate applied with the fixed potential, a fourth MOS transistor having a current path serially connected to a current path of said third MOS transistor and having a gate controlled by a control signal used for setting a second current value and a second switching element connected in series with the current paths of said third and fourth MOS transistors, and a current passage circuit which generates a current which has a value smaller than that of one of the plurality of current passage circuits of said first circuit.

25. The semiconductor device according to claim 24, wherein said first and second switching elements include fuse elements.

26. The semiconductor device according to claim 24, wherein said first and second switching elements include MOS transistors having gates which are controlled.

27. The semiconductor device according to claim 18, wherein data read out from said memory cell array is data obtained after a verify readout is performed in one of a program operation and erase operation.

28. The semiconductor device according to claim 27, wherein a basic unit which is replaced by a redundancy column circuit includes one of said latch circuit groups.

29. The semiconductor device according to claim 18, wherein said first circuit includes a switch configured to separate a defective current path.

30. The semiconductor device according to claim 29, wherein said switch includes a fuse element.

31. The semiconductor device according to claim 29, wherein said switch includes a MOS transistor having a gate which is controlled.

32. A semiconductor device comprising:
a memory cell array including NAND cells arranged therein;
a plurality of latch circuits which temporally hold data read out from the memory cell array;
a first circuit configured to cause a current to flow through a current path connected to a corresponding latch circuit of the plurality of the latch circuits when binary logic data of one end of said plurality of latch circuits is "0", and interrupt the current when the binary logic data is "1", said first circuit outputting a first current which is a sum of currents flowing through the current path;
a second circuit configured to generate a second current which is predetermined;
a current control circuit connected to the first and second circuits, and configured to determine absolute values of the first current and the second current; and a third circuit configured to compare the first current output from the first circuit with the second current output from the second circuit, said third circuit detecting the value of "1" or "0" of the binary logic data of said one end of the plurality of latch circuits based on a result of the comparison between the first current and the second current.

33. The semiconductor device according to claim 32, wherein a signal for controlling the second current is input to the second circuit, and the second current varies in units of the same value as the first current.

34. The semiconductor device according to claim 32, wherein:
the first circuit comprises a plurality of current paths each of which includes (i) a first transistor having a gate voltage directly or indirectly controlled by the binary logic data of the one end of the plurality of latch circuits, (ii) a second transistor to which an output signal of the current control circuit is to be input, and (iii) a fuse element; and
the second circuit comprises a plurality of second current paths and a third current path, each of the second current paths including (i) a third transistor having a gate to which a second control signal for controlling the second current is to be input, and (ii) a fourth transistor to which the output signal of the current control circuit is to be input, the third current path allowing current to flow there through, which has a value smaller than a value in units of the first current flowing through the first circuit.

35. The semiconductor device according to claim 32, wherein the current control circuit includes a current generator which generates a predetermined current, and applies respective predetermined voltages to the first and second circuits, causing a current varying in proportion to the current generated from the current generator to flow through the first and second circuits.

36. A semiconductor device comprising:
a memory cell array including NAND cells arranged therein;
a plurality of latch circuits which temporarily hold data to be written into the memory cell array;
a first circuit configured to cause a current to flow through a current path connected to a corresponding latch circuit of the plurality of the latch circuits when binary logic data of one end of said plurality of latch circuits is "0", and interrupt the current when the binary logic data is "1", said first circuit outputting a first current which is a sum of currents flowing through the current path;
a second circuit configured to generate a second current which is predetermined;
a current control circuit connected to the first and second circuits, and configured to determine absolute values of the first current and the second current; and
a third circuit configured to compare the first current output from the first circuit with the second current output from the second circuit, said third circuit detecting the value of "1" or "0" of the binary logic data of said one end of the plurality of latch circuits based on a result of the comparison between the first current and the second current.

37. The semiconductor device according to claim 36, wherein a signal for controlling the second current is input to the second circuit, and the second current varies in units of the same value as the first current.

38. The semiconductor device according to claim 37, wherein:
the first circuit comprises a plurality of current paths each of which includes (i) a first transistor having a gate voltage directly or indirectly controlled by the binary logic data of the one end of the plurality of latch circuits, (ii) a second transistor to which an output signal of the current control circuit is to be input, and (iii) a fuse element; and
the second circuit comprises a plurality of second current paths and a third current path, each of the second current paths including (i) a third transistor having a gate to which a second control signal for controlling the second current is to be input, and (ii) a fourth transistor to which the output signal of the current control circuit is to be input, the third current path allowing current to flow there through, which has a value smaller than a value in units of the first current flowing through the first circuit.

39. The semiconductor device according to claim 36, wherein the current control circuit includes a current generator which generates a predetermined current, and applies respective predetermined voltages to the first and second circuits, causing a current varying in proportion to the current generated from the current generator to flow through the first and second circuits.

40. A semiconductor device comprising:
a memory cell array including NAND cells arranged therein;
a plurality of latch circuit groups each having a predetermined number of latch circuits which temporarily hold data read out from the memory cell array or data to be written into the memory cell;
a first circuit configured to cause a current to flow through a current path connected to a corresponding latch circuit group of the plurality of the latch circuit groups when binary logic data of one end of said plurality of latch circuit groups is "0", and interrupt the current when the binary logic data is "1", said first circuit outputting a first current which is a sum of currents flowing through the current path;
a second circuit configured to generate a second current which is predetermined;
a current control circuit connected to the first and second circuits, and configured to determine absolute values of the first current and the second current; and
a third circuit configured to compare the first current output from the first circuit with the second current output from the second circuit, said third circuit detecting the value of "1" or "0" of the binary logic data of said one end of the plurality of latch circuit groups based on a result of the comparison between the first current and the second current.

41. The semiconductor device according to claim 40, wherein said plurality of latch circuit groups include at least a sense amplifier or a data register simultaneously selected by one column address.

42. The semiconductor device according to claim 40, wherein the value of "1" or "0" detected from said one end of said plurality of latch circuit groups is equal to the number of failed bytes after a verify readout of the program operation is performed.

43. The semiconductor device according to claim 40, wherein a signal for controlling the second current is input to the second circuit, and the second current varies in units of the same value as the first current.

44. The semiconductor device according to claim 43, wherein:

the first circuit comprises a plurality of current paths each of which includes (i) a first transistor having a gate voltage directly or indirectly controlled by the binary logic data of the one end of the plurality of latch circuits, (ii) a second transistor to which an output signal of the current control circuit is to be input, and (iii) a fuse element; and the second circuit comprises a plurality of second current paths and a third current path, each of the second current paths including (i) a third transistor having a gate to which a second control signal for controlling the second current is to be input, and (ii) a fourth transistor to which the output signal of the current control circuit is to be input, the third current path allowing a current to flow there through, which has a value smaller than a value in units of the first current flowing through the first circuit.

45. The semiconductor device according to claim 40, wherein the current control circuit includes a current generator which generates a predetermined current, and applies respective predetermined voltage to the first and second circuits, causing a current varying in proportion to the current generated from the current generator to flow through the first and second circuits.

* * * * *